(12) United States Patent
König et al.

(10) Patent No.: US 7,933,302 B2
(45) Date of Patent: Apr. 26, 2011

(54) LASER ARRANGEMENT HAVING A LASER DIODE APPARATUS AND METHOD FOR STABILIZING OPERATING TEMPERATURE DISTRIBUTION OF A LASER DIODE APPARATUS

(75) Inventors: Harald König, Bernhardswald (DE); Peter Brick, Regensburg (DE); Jürgen Moosburger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 139 days.

(21) Appl. No.: 12/343,448

(22) Filed: Dec. 23, 2008

(65) Prior Publication Data
US 2009/0196316 A1     Aug. 6, 2009

Related U.S. Application Data

(62) Division of application No. 11/541,131, filed on Sep. 28, 2006, now Pat. No. 7,468,999.

(30) Foreign Application Priority Data

Sep. 29, 2005   (DE) .......................... 10 2005 046 785

(51) Int. Cl.
*H01S 3/04*    (2006.01)
(52) U.S. Cl. ........ 372/36; 372/34; 372/43.01; 372/50.1; 372/50.12
(58) Field of Classification Search ................... 372/34, 372/36, 43.01, 50.12
See application file for complete search history.

(56) References Cited

U.S. PATENT DOCUMENTS

| 4,069,463 | A  | 1/1978  | McGroddy et al. |
| 4,751,711 | A  | 6/1988  | Welch et al. |
| 4,901,330 | A  | 2/1990  | Wolfram et al. |
| 6,167,074 | A  | 12/2000 | Sun et al. |
| 6,862,304 | B2 | 3/2005  | Maurer et al. |
| 2003/0174753 | A1 | 9/2003 | Yabuki et al. |
| 2004/0052280 | A1 | 3/2004 | Rice |
| 2006/0018355 | A1* | 1/2006 | Feitisch et al. ............. 372/50.12 |

FOREIGN PATENT DOCUMENTS

| EP | 1 182 757 | 2/2002 |
| JP | 2002-335046 | 11/2002 |
| JP | 2003-031905 | 1/2003 |
| JP | 2003-069152 | 3/2003 |
| JP | 2005-216925 | 8/2005 |

\* cited by examiner

*Primary Examiner* — Dung T Nguyen
(74) *Attorney, Agent, or Firm* — Cohen Pontani Lieberman & Pavane LLP

(57) ABSTRACT

A laser arrangement has at least one laser diode apparatus with a side surface which laterally limits the laser diode apparatus. The laser arrangement has a plurality of active regions arranged laterally side by side and configured to generate radiation. The laser diode apparatus is arranged on a mount. The distance between the side surface and an edge which laterally limits the mount on the part of the side surface is shorter than the distance between the side surface and the active region closest to the side surface. Additionally or alternatively, the distance between the side surface and the edge is shorter than one of the distances between two adjacent active regions of the laser diode apparatus.

6 Claims, 10 Drawing Sheets

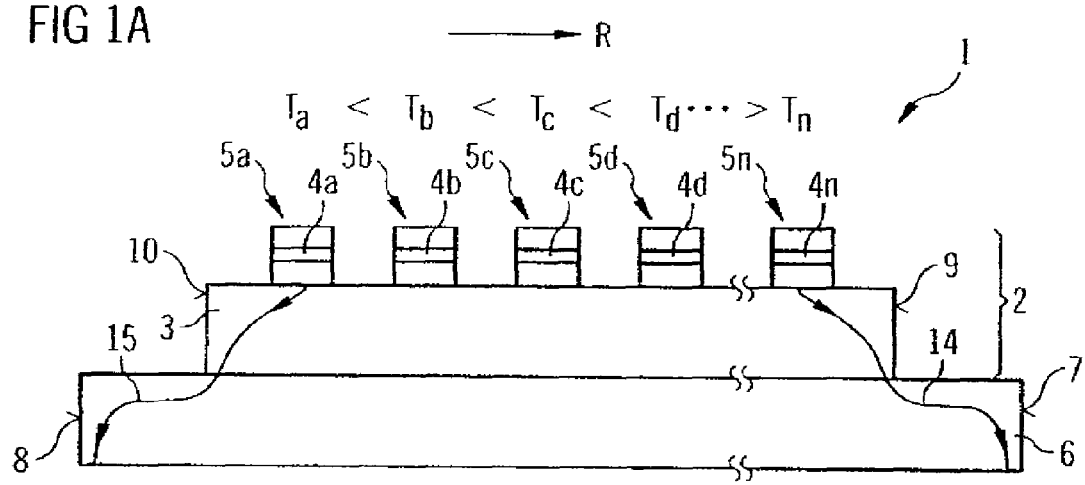
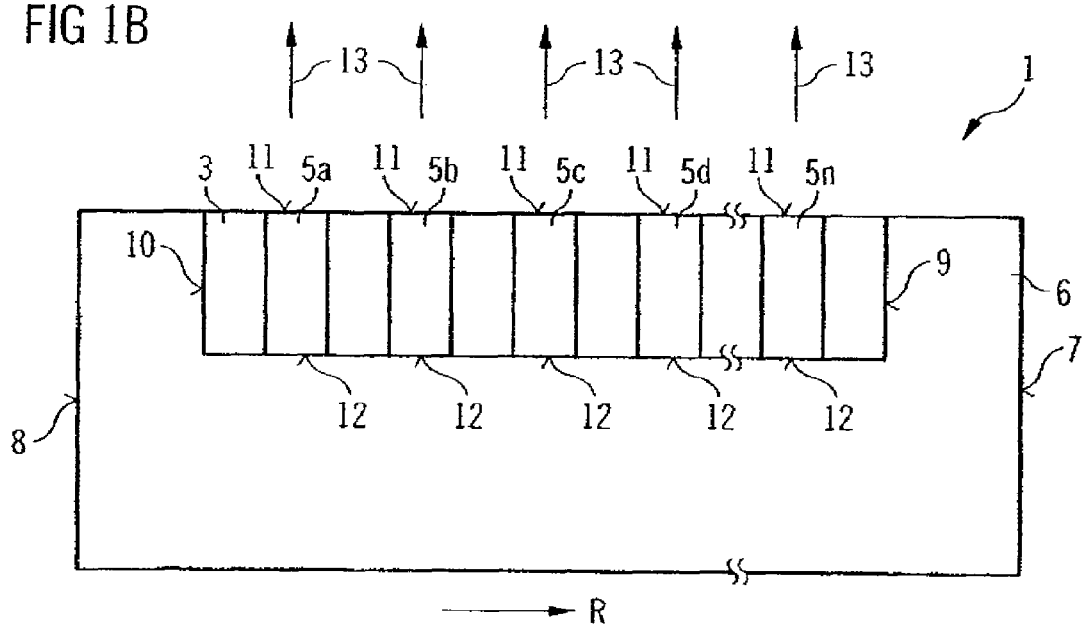

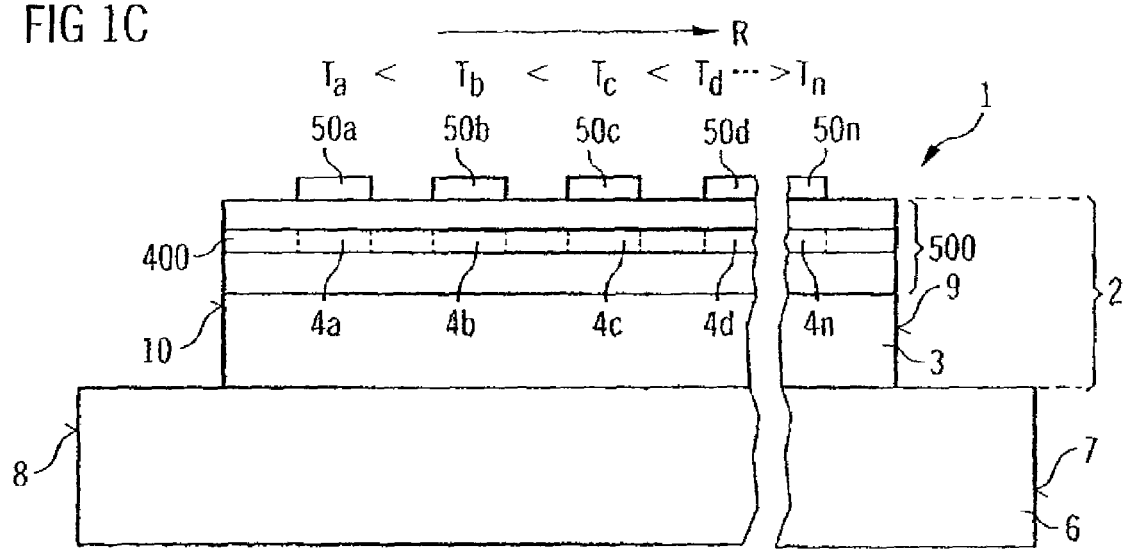
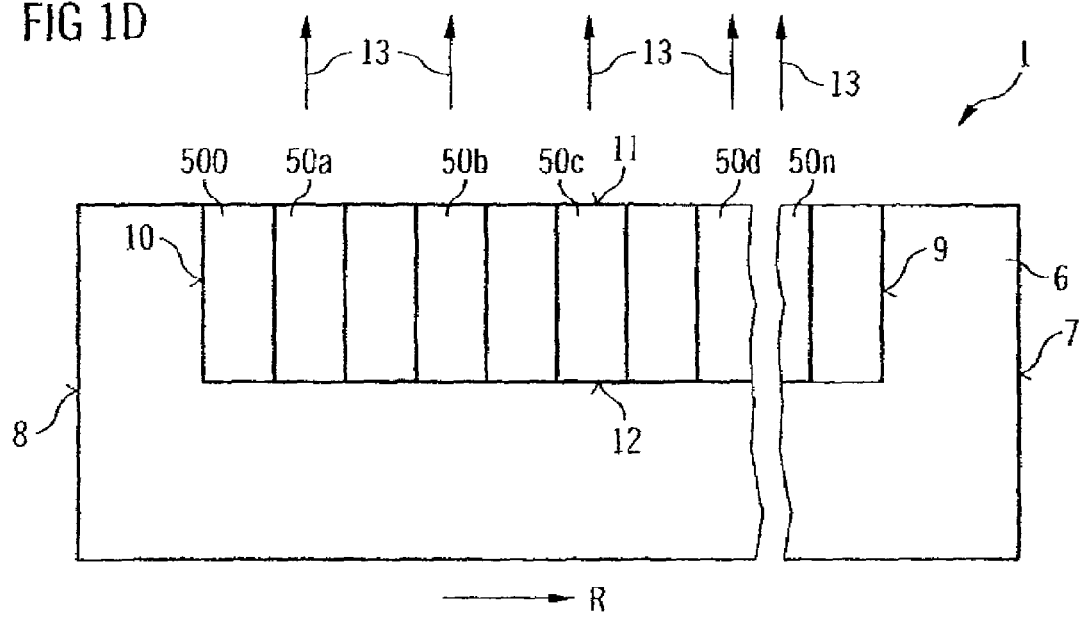

$T_a = T_b = T_c = T_d = \cdots = T_n$

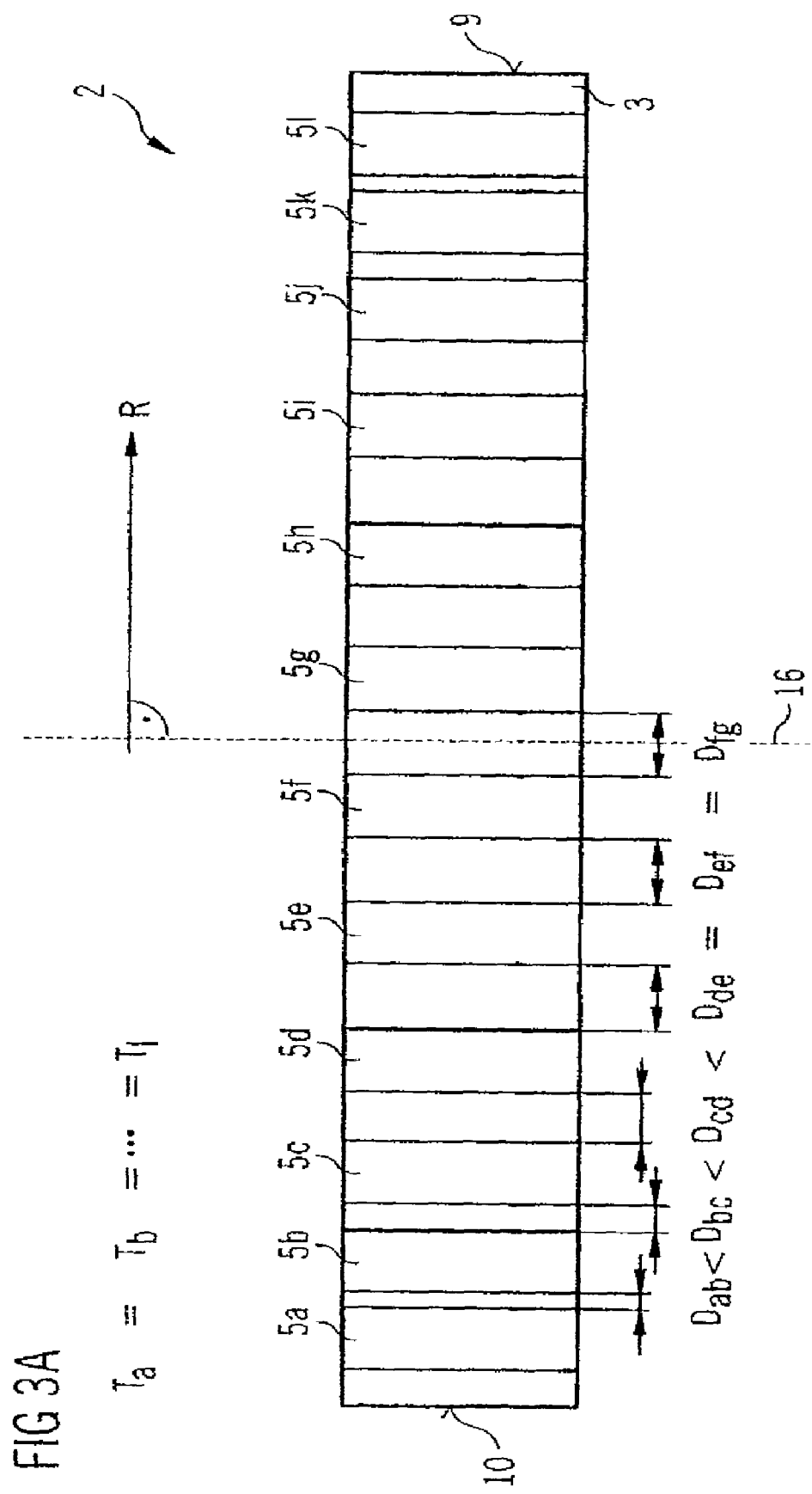

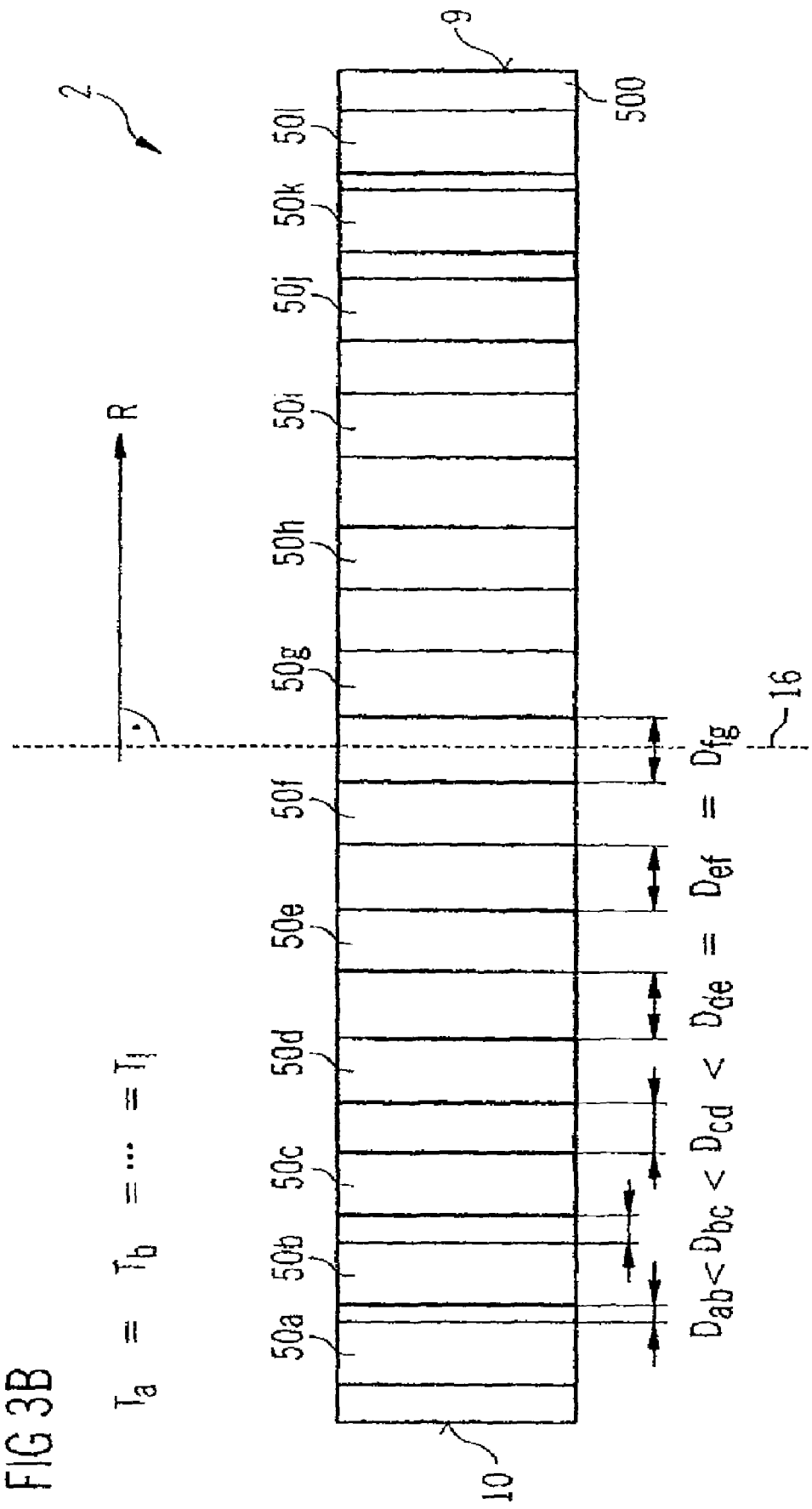

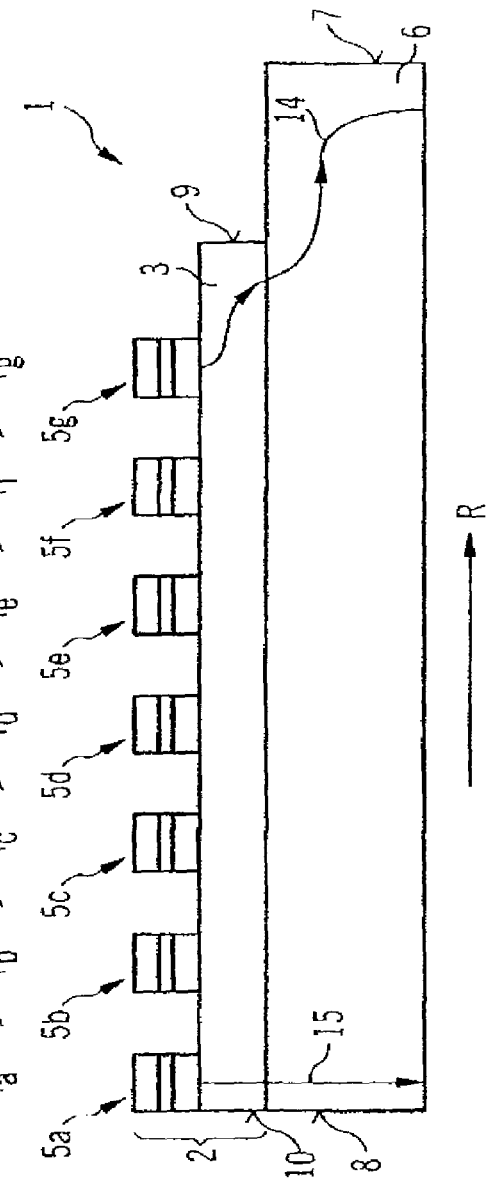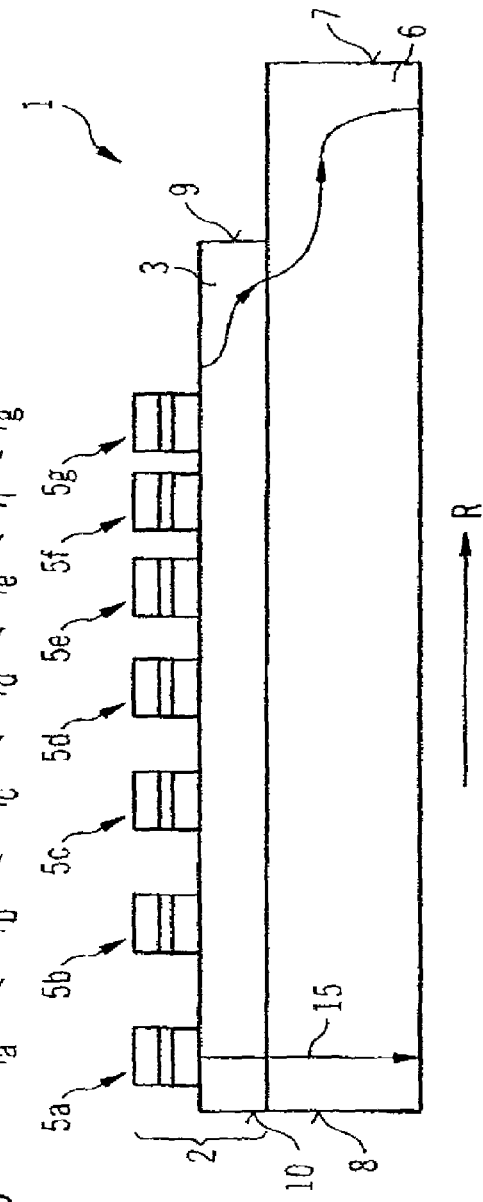

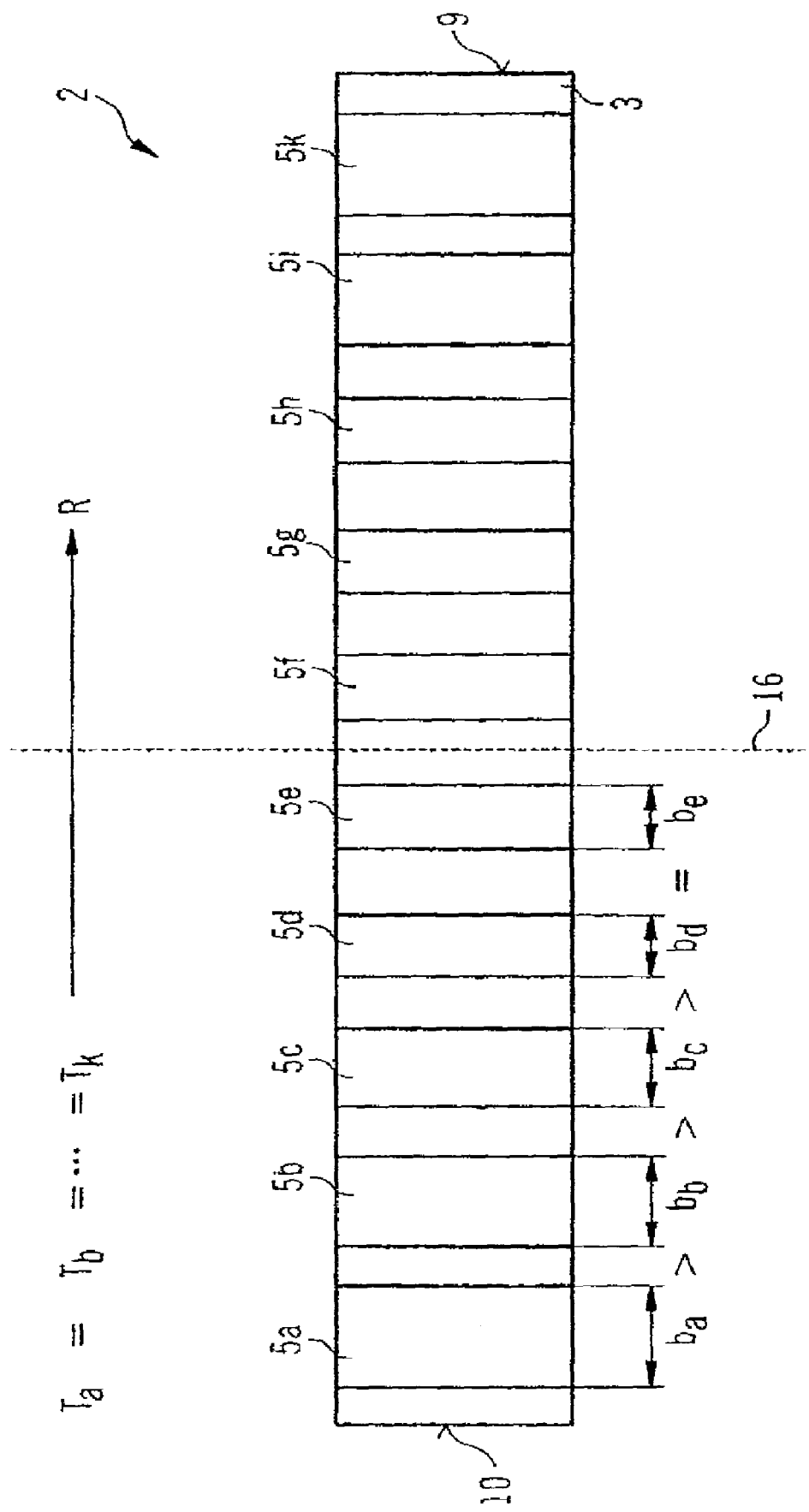

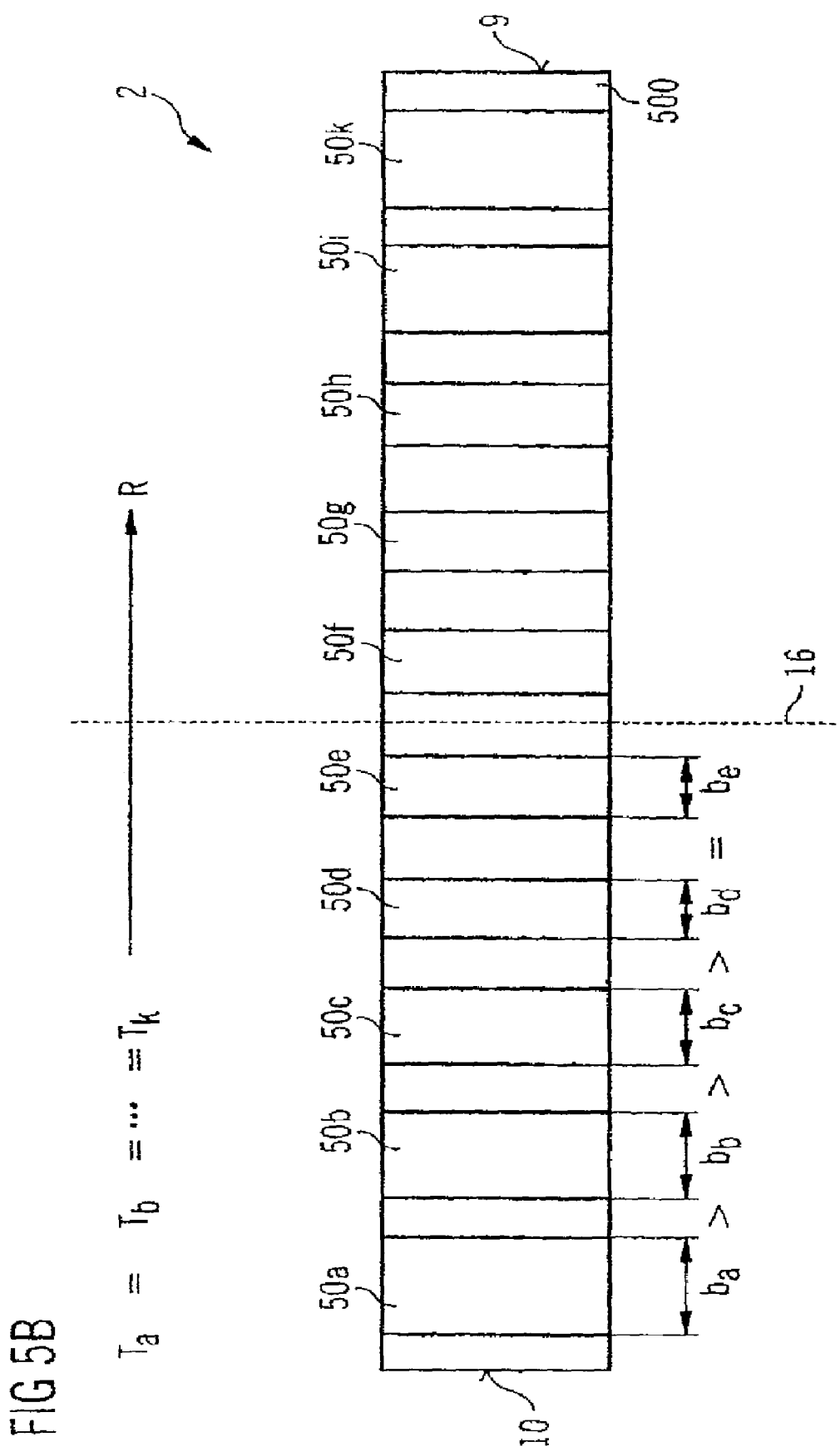

LASER ARRANGEMENT HAVING A LASER DIODE APPARATUS AND METHOD FOR STABILIZING OPERATING TEMPERATURE DISTRIBUTION OF A LASER DIODE APPARATUS

CROSS REFERENCE TO RELATED APPLICATIONS

This patent application is a division of U.S. patent application Ser. No. 11/541,131 filed Sep. 28, 2006, now U.S. Pat. No. 7,468,999 claiming priority to German Patent Application No. 10 2005 046 785.5 filed Sep. 29, 2005, the entire disclosure content of which is hereby incorporated by reference.

FIELD OF THE INVENTION

The present invention relates to a laser arrangement having a laser diode apparatus. The invention also relates to a method for stabilizing operating temperature distribution of a laser diode apparatus.

BACKGROUND OF THE INVENTION

The peak wavelength of the radiation which is produced in a single active region of a laser diode chip frequently has a significant temperature response, that is to say it varies with the operating temperature of the active region. In the case of laser diodes based on gallium arsenide, the peak wavelength typically changes by approximately 0.3 nm/K. The operating temperature is generally governed primarily by the loss heat which occurs during radiation production, with the quantity of loss heat depending on the conversion efficiency of electrical power to radiation power in the active region of the laser diode, in the case of electrically pumped lasers.

In the case of laser diode arrangements having a plurality of active regions, different active regions may be at different operating temperatures. This can lead to an increase in the differences between the peak wavelengths of the radiation produced in the respective active regions, or may be a reason for the occurrence of such differences.

SUMMARY OF THE INVENTION

One object of the present invention is to provide a laser arrangement having a laser diode apparatus, in which case the laser diode apparatus and the laser arrangement can be operated in a simplified form, with less fluctuation between the operating temperatures of different active regions.

This and other objects are attained in accordance with one aspect of the present invention directed to a laser diode apparatus having a plurality of active regions which are arranged laterally side by side and are suitable for radiation production, with a lateral dimension of the active regions being varied in the lateral direction, and/or the distance between adjacent active regions being varied in the lateral direction.

The active regions are expediently designed to produce radiation during operation of the laser diode apparatus.

The laser diode apparatus preferably has a lateral main direction of extent. The active regions are particularly preferably arranged in a row side by side along the main direction of extent.

Two active regions between which a further active region is arranged are not to be regarded as adjacent active regions in the above sense.

The radiation-producing active area of the respective active region can be varied by variation of the lateral dimensions of the active regions. This makes it possible to deliberately influence the quantity of loss heat which occurs in the respective active region. The larger the radiation-producing area, the greater the quantity of loss heat which is produced in the respective active region generally is and, correspondingly, also the operating temperature of the respective active region. The operating temperature distribution over the active regions of the laser diode apparatus can accordingly be influenced deliberately by local variation of the lateral dimension of the active regions, and in particular by variation of the active area of the active regions.

A corresponding situation applies to the variation of the distance between adjacent active regions. The operating temperatures of two adjacent active regions are generally increased as the distance between these active regions is decreased, because the loss heat is then produced in a locally more concentrated form.

A predetermined distribution of the operating temperature of the various active regions of the laser diode apparatus in the lateral direction can be achieved in a simplified manner by suitable variations of the distance between adjacent active regions and/or the lateral dimension of the active regions of the laser diode apparatus. The operating temperature distribution is preferably formed by appropriate arrangement and/or configuration of the active regions in such a manner as to produce a predetermined operating temperature distribution.

The active regions are preferably arranged and/or configured in such a manner that, during operation of the laser diode apparatus, this results in an operating temperature distribution over different active regions along a lateral main extent direction of the laser diode apparatus which is more homogeneous than in the case of a further laser diode apparatus which, by way of example, has active regions arranged equidistantly, with each of the active regions having the same lateral dimension. This allows for a laser diode apparatus to be designed with a stabilized operating temperature.

In particular, the active regions can be arranged and/or configured such that the operating temperature of the active regions is the same at corresponding locations selected in the same way in the respective active region.

For this purpose, by way of example, a reference laser diode apparatus can first of all be manufactured which has active regions arranged equidistantly and with the same lateral dimensions. The operating temperature distribution of the reference laser diode apparatus can then be measured. In zones of the reference laser diode apparatus in which the active regions are at a comparatively low operating temperature, the laserdiode apparatus which is then to be produced and whose operating temperature is stabilized is designed to have active regions whose lateral dimension is greater than that of the reference laser diode apparatus, and/or to have active regions whose separation is less than that of the active regions of the reference laser diode apparatus. In comparison to the active regions with a low operating temperature in the reference laser diode apparatus, the quantity of loss heat in this zone of the laser diode apparatus is deliberately increased in the laser diode apparatus whose operating temperature is stabilized. This then results in a correspondingly increased operating temperature in the respective active regions of the laser diode apparatus whose operating temperature is stabilized.

In consequence, the peak wavelengths of the laser radiation produced by the active regions of the laser diode apparatus can be stabilized. This is particularly advantageous in the case of active regions which are designed to be identical, in particular to produce radiation at the same peak wavelengths and at the same operating temperature. The emission spectrum of the laser diode apparatus can thus be narrowed, owing to the stabilization of the peak wavelengths, in comparison to an emission spectrum from a laser diode apparatus which has an inhomogeneous operating temperature distribution over different active regions. This is particularly advantageous for applications for which a narrowband emission spectrum is expedient.

A narrowband emission spectrum is advantageous, for example, in the case of pump applications, in which a laser diode apparatus is used for optical pumping of a further radiation source, such as a laser.

A laser to be pumped in this way may be in the form of a solid-state laser, for example a solid-state disk laser or solid-state rod laser, a fiber laser or a semiconductor laser, for example a semiconductor laser with an external resonator and/or a semiconductor disk laser. Lasers to be pumped optically generally have a comparatively narrowband absorption spectrum in the medium of the laser which is to be pumped. Broadening of the emission characteristic of the laser diode apparatus thus reduces the pumping efficiency of the laser diode arrangement which is used as the pump laser. Such a broadening of the emission spectrum can be counteracted by the design of the laser diode apparatus according to the invention.

In principle, the operating temperature distribution could also be homogenized by increasing the efficiency of the active regions for radiation production, with a corresponding reduction in the production of loss heat. However, this is comparatively complex and costly in comparison to the variation of the lateral dimension of the active regions, or of the distance between adjacent active regions.

In one preferred refinement, the laser diode apparatus has at least one side surface which laterally limits the laser diode apparatus. In the region of the side surface, the operating temperature of the active regions which are arranged in this region of the laser diode apparatus, for example because of better heat dissipation or because less loss heat is produced, is often less than in regions which are further away from the side surface.

In one preferred refinement of the laser diode apparatus, the lateral dimension of one active region is therefore greater than the lateral dimension of another active region, with this active region being adjacent to the first active region, and being further away from the side surface than the first active region.

Alternatively or additionally, the distance between the active regions of one pair with two adjacent active regions is preferably shorter than the distance between the active regions of another pair with two adjacent active regions, which is further away from the side surface than the first pair. In this case, at least one active region of the other pair is further away from the side surface than each active region of the first pair. If applicable, both pairs may have one common active region. An arrangement of this kind allows for increased loss heat to be produced in a simplified manner in the region of the side surface, so that the operating temperature can be increased deliberately in those active regions of the laser diode apparatus which are arranged close to the side surface.

In a further preferred refinement, the lateral dimension of the active regions decreases, in particular the respective lateral dimension, as the distance between the active regions and the side surface increases, in particular stepwise.

Alternatively or additionally, the distance, in particular the respective distance, between adjacent active regions prefer-ably increases as the distance between the active regions and the side surface increases, in particular in steps. The loss heat which is produced in active regions that are comparatively far away from the side surface can be reduced in a simplified manner by this arrangement, as well as the operating temperature of these active regions. This makes it possible to achieve a homogeneous operating temperature distribution in the lateral direction over the active regions of the laser diode apparatus, in a simplified manner.

The laser diode apparatus preferably has four or more, particular preferably ten or more, active regions. Fluctuations in the operating temperature distribution between individual active regions occur to an increased extent in a laser diode apparatus such as this, because of the large number of active regions. Thus, in this case, homogenization of the operating temperature distribution has a particularly pronounced effect.

In one preferred refinement, the active regions of the laser diode apparatus are arranged on a common substrate. This allows the laser diode apparatus to be designed to be particularly compact, with the substrate preferably mechanically stabilizing the active regions. Since, when the laser diode apparatus is designed to be compact in this way, inhomogeneities in the operating temperature distribution of the active regions are particularly strongly pronounced. Thus, homogenization of the operating temperature is particularly advantageous in this case.

That side surface which limits the laser diode apparatus in the lateral direction is preferably formed by the substrate, at least in places.

In order to prevent lateral widening of the heat flow and reduction in the operating temperature associated therewith in active regions which are arranged comparatively close to that region of the side surface which is formed by the substrate, that active region which is closest to the side surface, in particular that active region which is closest to the region of the side surface formed by the substrate, is preferably arranged at a distance from the side surface which is shorter than or equal to one of the distances between two adjacent active regions.

In a further preferred refinement, the distance between that active region which is closest to the side surface and the side surface is shorter than the distance between this active region and an active region which is adjacent to this active region and is preferably arranged on that side of the active region closest to the side surface facing away from that side surface.

Furthermore, the distance between that region of the side surface which is formed by the substrate and the closest active region is preferably shorter than the shortest of the distances between the active regions. If the distance between the active regions in the laser diode apparatus varies, the operating temperatures of the active regions can in this way be matched to one another in a simplified manner. If applicable, one active region may adjoin the side surface, and/or end flush with the side surface.

In a further preferred refinement, the active regions are arranged axially symmetrically with respect to an axis of symmetry of the laser diode apparatus. The axis of symmetry is preferably arranged perpendicularly to the lateral direction of main extent of the laser diode apparatus, or runs essentially parallel to one surface of the substrate, on which the active regions are arranged. A symmetrical arrangement of this kind makes it easier to achieve a homogeneous, symmetrical operating temperature distribution over the active regions of the laser diode apparatus.

In a first advantageous development, two active regions of the laser diode apparatus, in particular all of the active regions of the laser diode apparatus, are each associated with discrete laser diode chips. These chips are expediently mounted on the substrate. The substrate is in this case preferably formed by a heat sink or a submount. The submount is preferably in the form of a heat spreader. The heat spreader is particularly preferably arranged between the laser diode chips and an additionally provided heat sink.

The submount is preferably matched to the thermal coefficient of expansion of the laser diode chips, which are preferably designed to be identical. In the case of discrete laser diode chips, the operating temperature can be stabilized in a particularly simple manner by appropriate choice of the distances between the individual chips when the chips are being mounted on the substrate. In the case of discrete laser diode chips, the active regions and in particular the individual laser diode chips are separated from one another by a free space. The laser diode chips are preferably implemented as edge-emitting lasers.

In a further advantageous development, two active regions are associated with one common laser diode chip, in particular a laser diode bar. In this case, the substrate is preferably formed by the growth substrate for the active regions of the laser diode chip, or is formed from the growth substrate. The laser diode apparatus is preferably implemented as a laser diode chip.

Two active regions of the laser diode chip, preferably all of the active regions of the chip, may in this case be formed by regions of a continuous active layer, which regions are provided with current discretely from one another, and which layer is preferably part of a semiconductor layer sequence of the laser diode chip. Alternatively or additionally, two active regions of the laser diode chip can be separated from one another by a free space. In particular, the active regions may be formed in semiconductor bodies which are separated from one another by a free space.

Active regions of the laser diode chip are preferably either in the form of regions of a continuous active layer which are provided with current discretely from one to the other, or are separated from one another by a free space.

In the former case, the operating temperature distribution can be homogenized by a suitable configuration of electrical contacts, for example contact metallizations, for current injection into the respective active region. The contacts may be arranged striplike, and in particular side by side on the active layer. Furthermore, the contact which is associated with the respective active region preferably covers this active region at least partially, and particularly preferably completely.

The features described further above and in the following text for the distances between and/or lateral dimensions of active regions can accordingly be used in a laser diode chip in which the corresponding active regions are formed by regions of a continuous active layer through which regions current flows discretely from one another, for the corresponding embodiment of the contacts for the discrete current injection into the active layer. Corresponding homogenization of the operating temperature distribution over the active regions can accordingly be achieved by the configuration of the contact geometry—variation of the width and/or of the distances between the contacts in the lateral direction—for the current flow for discrete active regions.

If the laser diode chip is designed with active regions which are separated from one another by a free space, for example in discrete semiconductor bodies, a semiconductor layer sequence with an active layer can be structured by means of a suitable mask in such a manner that the lateral dimensions of adjacent active regions and/or the distances between adjacent active regions—for example between discrete subregions of the active layer which is continuous before the structuring process—vary over the chip.

In the case of a laser diode bar, the active regions, in particular a semiconductor layer structure which comprises the respective active region, are preferably configured for an edge-emitting laser structure. Edge-emitting laser structures emit radiation essentially parallel to the active region. Furthermore, the active regions are preferably designed to be identical, that is to say in order to produce radiation of the same peak wavelength at the same operating temperature. The active regions, in particular the active layer, may for example be grown epitaxially on the substrate, which is then used as a growth substrate.

A laser diode bar is often used to produce a high radiation power, and is accordingly operated with a high electrical power. Because of the high electrical power consumption, the peak wavelengths of the radiation produced in different active regions may differ from one another considerably if the operating temperature distribution over the active regions of a laser diode bar is not stabilized adequately. Differing peak wavelengths can be avoided within the scope of the invention.

A laser arrangement according to an embodiment of the invention has at least one laser diode apparatus which has a side surface which laterally limits the laser diode apparatus, and has a plurality of active regions which are arranged laterally side by side and are suitable for radiation production, with the laser diode apparatus being arranged on a mount, and the distance between the side surface and an edge which laterally limits the mount on the part of the side surface is shorter than the distance between the active region closest to the side surface and the side surface, and/or the distance between the side surface and the edge is shorter than one of the distances between two adjacent active regions of the laser diode apparatus.

The active regions are expediently designed to produce radiation during operation of the laser diode apparatus.

The mount for the laser diode apparatus is thus matched to the size of the laser diode apparatus. The mount is preferably matched to the laser diode apparatus in such a manner that the lateral widening of the heat flow, particularly in the mount, is reduced. In the same way as by the measures described further above, this also allows for influencing the operating temperature distribution over the active regions of the laser diode apparatus. Loss heat which is dissipated from the laser diode apparatus into the mount in the region of the side surface of the apparatus is subject to only a relatively small amount of lateral widening of the heat flow in the edge-region of the mount because of the side surface and the mount edge being arranged comparatively close to one another. The operating temperature of the active regions which are located comparatively close to the side surface is thus not considerably less than the operating temperature of active regions that are further away from the side surface. This is because of the only moderate widening of the heat flow in the mount. The operating temperatures of the active regions can be matched to one another in a simplified manner by an arrangement of this kind of the laser diode apparatus relative to the mount. As has already been described further above, this makes it possible to stabilize the peak wavelengths of the radiation produced in the various active regions.

The mount preferably limits the laser arrangement at least in places in the lateral direction. An arrangement of the side surface as close as possible to the edge of the mount has been found to be particularly advantageous in order to reduce or completely avoid the widening of the heat flow in the edge region of the mount.

The distance of the side surface from the edge is preferably shorter than the shortest of the distances between the active regions of the laser diode apparatus. It is particularly preferable for the side surface, in particular on its side facing the mount, to end flush with the mount. This makes it possible to essentially completely avoid widening of the heat flow in the lateral direction in the mount.

Furthermore, the mount is preferably in the form of a heat sink or, in particular, a submount. Loss heat occurring in the active regions can thus be reliably dissipated away from the active regions.

If applicable, the submount may be arranged between the laser diode apparatus and another mount for the laser arrangement, for example a heat sink. Such as compared to the heat sink, the submount is preferably better matched to the thermal coefficient of expansion of an element of the laser diode apparatus on the side facing the submount. In particular with respect to the thermal coefficient of expansion, the mount can thus be matched to the thermal coefficient of expansion of the laser diode apparatus with, for example, a discrepancy of 5% or less. This makes it possible to reduce the risk of thermally caused damage to the laser diode apparatus.

A submount containing copper-tungsten (CuWo) is particularly suitable for matching of the thermal coefficient of expansion, and for good thermal conductivity. The ratio of copper to tungsten can be used to vary the thermal coefficient of expansion of a heat spreader such as this and to match it to the thermal coefficient of expansion of the laser diode apparatus, in particular to that of the substrate of the laser diode apparatus or that of a semiconductor material arranged on the part of the heat spreader. Particularly good thermal matching can be achieved for a laser diode chip based on gallium arsenide, for example with a (growth) substrate containing gallium arsenide, and/or an active region based on gallium arsenide.

A copper heat sink is particularly suitable for use as a heat sink.

In a further preferred refinement, the substrate is arranged on the side of the active regions facing away from the mount. The heat dissipation from the active regions to the mount can be improved in this way since the heat need not be passed through the substrate. The substrate is in this case expediently formed by the growth substrate. The risk of damage to the laser diode apparatus as a result of temperatures that are raised because of a heat jam can thus be reduced. However, because of the better heat dissipation, differences in the operating temperatures of the active regions are increased in a particularly pronounced form when the substrate is arranged in this way. In this case, it is particularly advantageous to stabilize the operating temperature by variation of the lateral dimensions and/or the distances between the active regions, and/or to appropriately match the dimensions of the laser diode apparatus to the mount.

In a further preferred refinement, the contacts for the active regions are arranged between the mount and the active layer.

The laser diode apparatus of the laser arrangement is preferably implemented as a laser diode apparatus according to an embodiment of the invention as described above. The operating temperature distribution can thus be influenced to a greater extent and in a simplified manner. Features which have been described above and those which will be described in the following text in conjunction with the laser diode apparatus according to embodiments of the invention can thus also apply to the laser arrangement according to embodiments of the invention, and vice versa.

The laser arrangement and the laser diode apparatus can be designed in a simplified form, owing to the capability to influence the operating temperature distribution, with the operating temperature distribution running in the same way in the lateral direction in the respective active regions. This effect is particularly pronounced in the case of active regions which are designed to be identical and which the laser diode apparatus preferably has. These should nominally emit radiation at the same peak wavelength, although this wavelength may vary owing to differences in the operating temperature. This fluctuation can be reduced or completely overcome by the invention. A laser diode apparatus whose operating temperature is stabilized in this way, or a corresponding laser arrangement, is accordingly particularly suitable for a pump application, in which a radiation source to be pumped is pumped optically by means of absorption of the radiation produced by the laser diode apparatus.

An optically pumped laser according to embodiments of the invention is pumped by means of a laser diode apparatus according to embodiments of the invention, or by means of a laser arrangement according to embodiments of the invention.

Owing to the stable peak wavelength, these lasers are particularly suitable for use as pump lasers for efficient pumping.

The laser to be pumped is preferably in the form of a solid-state laser, in particular a solid-state disk laser or a solid-state rod laser, a fiber laser or a semiconductor laser, in particular a semiconductor disk laser.

The pump radiation source is particularly suitable for pumping a semiconductor laser, in particular a surface-emitting semiconductor laser, which is intended for operation with an external resonator. For example, the semiconductor laser is in the form of a VECSEL (Vertical External Cavity Surface Emitting Laser) and/or a disk laser.

BRIEF DESCRIPTION OF THE DRAWINGS

FIGS. 1A to 1F show exemplary embodiments of a laser arrangement on the basis of a schematic section view in FIG. 1A and a schematic plan view in FIG. 1B, a further laser arrangement on the basis of corresponding views in FIGS. 1C and 1D, and a further laser arrangement in FIG. 1E, and also the quantitative operating temperature profile of a laser arrangement in FIG. 1F;

FIGS. 3A-3B show two exemplary embodiments of a laser diode chip on the basis of schematic plan views;

FIGS. 4A-4B show two exemplary embodiments of a laser arrangement on the basis of schematic section views;

FIGS. 5A-5B show two further exemplary embodiments of a laser diode chip on the basis of schematic plan views;

DETAILED DESCRIPTION OF THE DRAWINGS

Figure 1E:
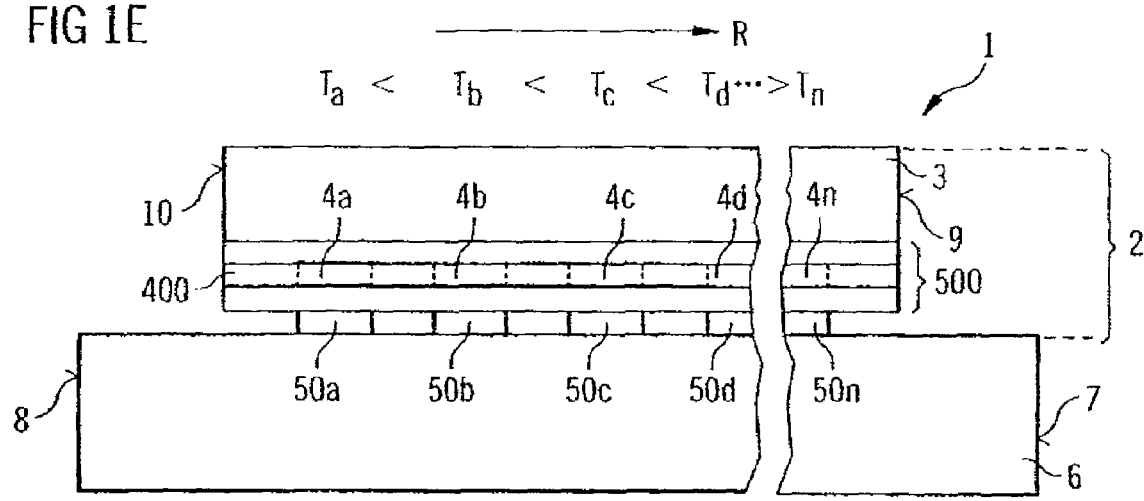

Identical elements, elements of the same kind and identically acting elements are provided with the same reference symbols in the Figures.

A laser arrangement 1 is shown as a schematic section view in FIG. 1A and a schematic plan view onto the laser arrangement in FIG. 1B.

The laser arrangement 1 has a laser diode chip 2, which comprises a plurality of active regions 4a, 4b, 4c, 4d, . . . , 4n which are arranged side by side on a common substrate 3 along a lateral direction of main extent R of the laser diode chip and are suitable for radiation production. The laser diode chip 2 preferably comprises ten or more active regions, for example twelve active regions.

As is shown in the illustration in FIGS. 1A and 1B, an active region is in each case formed in a semiconductor body 5a, 5b, 5c, 5d, . . . 5n. The semiconductor bodies 5a . . . 5n are in the form of discrete semiconductor structures, which are arranged spatially separated from one another on the substrate 3. The semiconductor bodies 5a . . . 5n are arranged in particular at equal intervals on the substrate 3 and have the same lateral dimensions, that is to say the same widths, along the lateral direction of main extent. A length dimension of the semiconductor bodies, that is to say their length, taken at right angles to the lateral main extent direction is preferably greater than the lateral dimension, and is particularly preferably constant. Furthermore, the active regions preferably have the same area content, that is to say the same active area.

The laser diode chip 2 in the laser arrangement 1 is arranged on a mount 6, with the substrate 3 preferably being arranged between the active regions 4a . . . 4n and the mount. In the lateral direction, the mount 6 is laterally bounded by a first edge surface 7 and a second edge surface 8, with the second edge surface 8 being arranged opposite of the first edge surface 7. The edge surfaces 7, 8 at the same time also bound the laser arrangement 1 in the lateral direction. The laser diode chip 2 is bounded in the lateral direction by a first side surface 9 and a second side surface 10. These are formed by the substrate 3. The second side surface 10 is arranged opposite of the first side surface 9. Furthermore, the edge surfaces 7, 8 are arranged at a distance from the side surfaces 9, 10. In addition, the active regions are arranged at a distance from the side surfaces 9 and 10, such that the laser arrangement has a structure which broadens laterally in the form of steps, starting from the active regions.

The semiconductor bodies 5a . . . 5n are formed on the basis of edge-emitting laser structures. A resonator for a laser structure of this kind can be formed by means of a first reflector surface 11 and a second reflector surface 12, which the respective semiconductor bodies 5a . . . 5n may have or which may be formed on the respective semiconductor body. One surface of the respective semiconductor body preferably forms the respective reflector surface. The first reflector surface 11 is preferably less reflective than the second reflector surface 12, so that, during operation of the laser diode chip 2, a radiation field can be formed in the resonator of the respective semiconductor body, can be amplified therein, and can be output from the resonator as laser radiation 13 via the reflector surface 11 which is used as the output surface.

The semiconductor bodies 5a . . . 5n are preferably monolithically integrated. The semiconductor bodies may be epitaxially grown on the substrate 3. The semiconductor bodies are preferably based on gallium arsenide. A gallium-arsenide substrate is in this case particularly suitable for use as the substrate, and in particular also as a growth substrate for epitaxial growth of the semiconductor bodies.

Furthermore, the active regions are preferably formed to be identical, in particular for emission of laser radiation at the same peak wavelength at the same operating temperature. Active regions which have a single-quantum-well or multiple-quantum-well structure are particularly suitable for efficient radiation production. The expression quantum-well structure does not include any details about the dimensions. It thus covers, inter alia, quantum troughs, quantum wires, quantum points and any combination of these structures.

Laser diode chips based on (In,Al)GaAs are particularly suitable for radiation production in the infrared spectral range.

During operation of the laser diode chips 2, e.g. in quasi-continuous long-pulse operation (qcw: quasi-continuous wave) or continuous wave operation (cw: continuous wave), radiation is produced in the active regions. The quantity of loss heat in this case generated can be considerably high. In the case of high-power laser diode chips—for example with an output power of a chip with one active region of $\geq 1$ W and for a chip with a plurality of active regions of $\geq 10$ W—the corresponding quantity of loss heat is particularly high. In order to avoid a significant increase in the risk of heat-caused damage to the active regions, the mount 6 is preferably implemented as a heat sink for heat dissipation from the laser diode chip. For this purpose, the mount 6 contains for example a metal, e.g. copper, or an alloy, e.g. copper-tungsten, with a thermal conductivity being advantageously high. The heat can be dissipated from the active regions via the substrate 3 into the mount 6.

The laser arrangement 1 with the mount 6 can be arranged on a connection carrier (not illustrated), for example a circuit board, and electrically contact connected thereon. The electrical contacts for the laser arrangement have not been illustrated explicitly, for clarity reasons. The mount may serve as a submount for the laser diode chip, and is arranged between the laser diode chip and the connection carrier and/or between the chip and an additional heat sink, for this purpose.

In those active regions which are adjacent to the side surfaces 9 and 10, or are arranged close to the respective side surfaces, for example the active regions 4a and 4n, the loss heat which occurs can be conducted within the substrate in the lateral direction to the respective side surface of the substrate. Heat which passes from the substrate 3 in the vertical direction into the mount 6 can be passed laterally in the direction of the edge surfaces 9 and 10 within the mount. The heat flow can thus be widened in the lateral direction within the substrate or within the mount. This is illustrated schematically in FIG. 1A by the heat flow lines 14 and 15, which widen in the lateral direction. The quantity of the loss heat which is produced in the edge regions of the laser diode chip, that is to say those regions close to the side surfaces, is less than in the middle, central region of the laser diode chip 2. Owing to the widening of the heat flow and the comparatively large area which is available for heat dissipation to the side of the side surface, this heat is dissipated from the active regions to an increased extent.

In consequence, an operating temperature gradient is formed in the active regions in the lateral direction. The operating temperatures $T_a, T_b, T_c, T_d, \ldots$ and $T_n$ of the active regions 4a, 4b, 4c, 4d, . . . and 4n, respectively, thus increase as the distance from the side surfaces 9 and 10 increases in the lateral direction. The further the active regions are away from the side surfaces 9 and 10 or the edge surfaces 7 and 8, the less the lateral widening of the heat flow in the edge region influences the operating temperature of the respective active regions. Rather, in zones of the laser diode chip which are relatively far away from the side surfaces, the heat can be dissipated from the active regions essentially without broadening of the heat flow, and directly in the vertical direction.

The operating temperatures of the active regions are preferably determined at corresponding locations in the respective active region along the lateral main extent direction. For example, the operating temperature of an active region is determined in the center of this active region on the side of the first reflector surface 11.

Also, when individual chips are arranged alongside one another, that is to say a plurality of laser diode chips which have been produced separately from one another but are mounted on a common chip mount, and assuming that the chips are arranged at equal distances, it is also possible for a gradient to occur in the operating temperature distribution as a result of the lateral widening of the heat flow (not explicitly illustrated). In this case, in the illustration in FIG. 1, the semiconductor bodies would correspond to individual laser diode chips, the substrate 3 to the chip mount which, for example, is in the form of a heat spreader or a submount, and the mount 6 to a heat sink or a connection carrier for the chips mounted onto the chip mount. For matching the thermal coefficients of expansion to the ones of the individual laser diode chips, a copper-tungsten submount and a copper heat sink are particularly suitable. The individual laser diode chips are preferably designed to produce radiation of the same peak wavelength.

The laser arrangement 1 illustrated schematically in FIGS. 1C and 1D corresponds essentially to the laser arrangement illustrated in FIGS. 1A and 1B. In contrast to this, the laser diode chip 2 has a semiconductor layer structure 500 with a continuous active layer 400, which is arranged on the substrate 3. The semiconductor layer structure 500 preferably ends flush with the side surfaces 9, 10 of the substrate 3. In contrast to FIGS. 1A and 1B, the active regions 4a . . . 4n of the laser diode chip 2 are formed by regions of the active layer 400 through which regions current flows discretely from one to the other during operation of the semiconductor chip. The reflector surfaces 11, 12 are also formed by a continuous surface. The active regions 4a . . . 4n are each covered by an electrical contact, in particular a contact metallization. One and only one contact is preferably associated with each active region.

The shape and the arrangement of the discrete contacts 50a . . . 50n correspond to the respective semiconductor bodies 5a . . . 5n as shown in FIGS. 1A and 1B. In particular, the contacts 50a . . . 50n are arranged at equal distances from one another in the lateral direction on the semiconductor layer structure 500. In consequence, the active regions 4a . . . 4n which produce radiation during operation of the laser diode chip 2 are likewise arranged at equal distances from one another.

The contacts are preferably in the form of contact strips which, in particular, run parallel to one another. Furthermore, the contacts have the same widths.

In a corresponding manner, the operating temperature distribution in the lateral direction in the laser diode chip 2 illustrated in FIGS. 1C and 1D can likewise run inhomogeneously, in the same way as in the case of the chip shown in FIGS. 1A and 1B. The continuous semiconductor layer structure which, in addition to the active layer 400, preferably also contains a plurality of additional semiconductor layers, can constrain the heat dissipation from the active regions even further. The fluctuations in the operating temperature may be increased even further in comparison to those active regions which are separated from one another by a free space.

The laser diode chip 2 can be fixed on the mount 6 by means of a preferably electrically and/or thermally conductive connection layer (not illustrated) and, in particular, can be electrically and/or thermally conductively connected to the mount 6. The connection layer is preferably arranged between the laser diode chip and the mount 6. The connection layer may be in the form of a solder layer, in particular an indium solder layer.

In order to arrange the active regions 4a . . . 4n closer to the mount for improved heat dissipation, the active regions can be arranged between the mount 6 and the substrate 3. In particular, the contacts 50a . . . 50n serving for discrete current impression into the active layer can be arranged between the semiconductor layer structure 500 and the mount 6 (FIG. 1E). The heat dissipation from the active regions can be improved by arranging the substrate 3 on that side of the active regions which faces away from the mount. The risk of damage to the laser diode chip caused by excessive temperatures during operation of the laser arrangement 1 is thus reduced. Since a refinement such as this improves the thermal link to the mount 6, lateral widening of the heat flow in the mount can be observed to an increased extent. This further increases the fluctuations in the peak wavelengths.

The laser diode chips illustrated in FIGS. 1A to 1E are preferably in the form of laser diode bars.

Figure 1F:
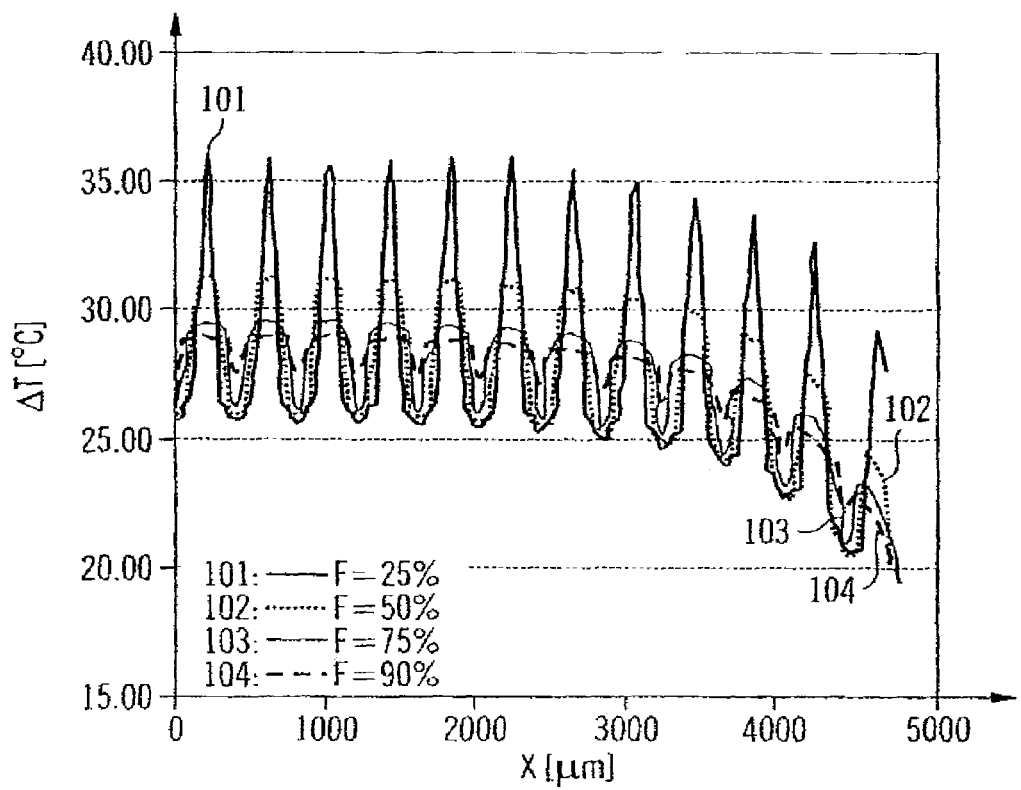

FIG. 1F shows the operating temperature profile quantitatively, that is to say the change in the operating temperature $\Delta T$ in DC along the distance x in μm along the lateral main extent direction, from the center of the laser diode chip in the direction of the side surface 9 of the substrate 3, for a laser arrangement similar to the arrangements shown in FIGS. 1A, 1B as well as IC, 1D and 1E for different filling factors F of the substrate with active regions. The decrease in the operating temperatures in the direction of the side surface can clearly be seen.

Since the peak wavelength of the radiation produced in the respective active region depends on its operating temperature, this operating temperature gradient leads to different peak wavelengths of the radiation produced in the respective active regions. The emission spectrum of the laser diode chip 2 is thus broadened because the peak wavelength is dependent on the temperature. This may be undesirable for applications of the laser arrangement such as the pumping of a solid-state laser, which in general has a narrow absorption spectrum. The peak wavelength may vary by 0.3 nm/K, so that differences in the operating temperature between different active regions of up to about 40 K, which can result in the lateral direction, can significantly influence the width of the emission spectrum of the laser diode chip.

The invention allows for this peak wavelength shift, which is dependent on the operating temperature gradient, to be counteracted by a suitable arrangement and/or configuration of the active regions of the laser diode chip 2 and/or suitable matching of the laser diode chip and of the mount to one another.

Figure 2A:
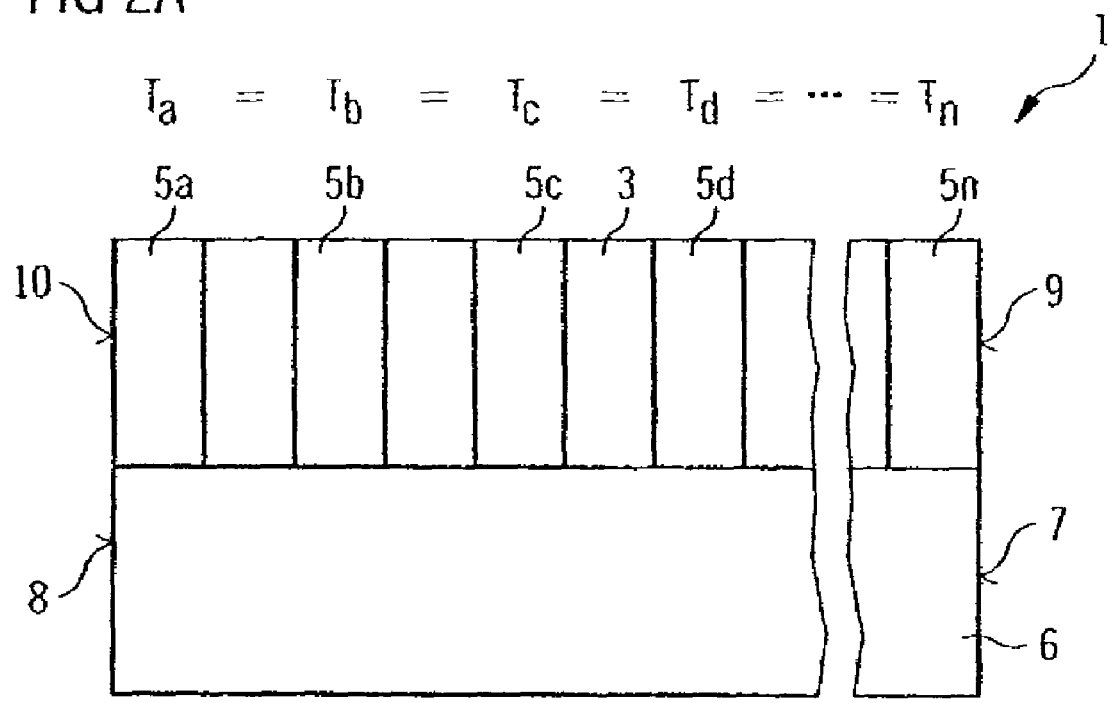
FIGS. 2A-2B show one exemplary embodiment of a laser arrangement on the basis of a schematic plan view in FIG. 2A and a schematic section view in FIG. 2B.
Figure 2B:
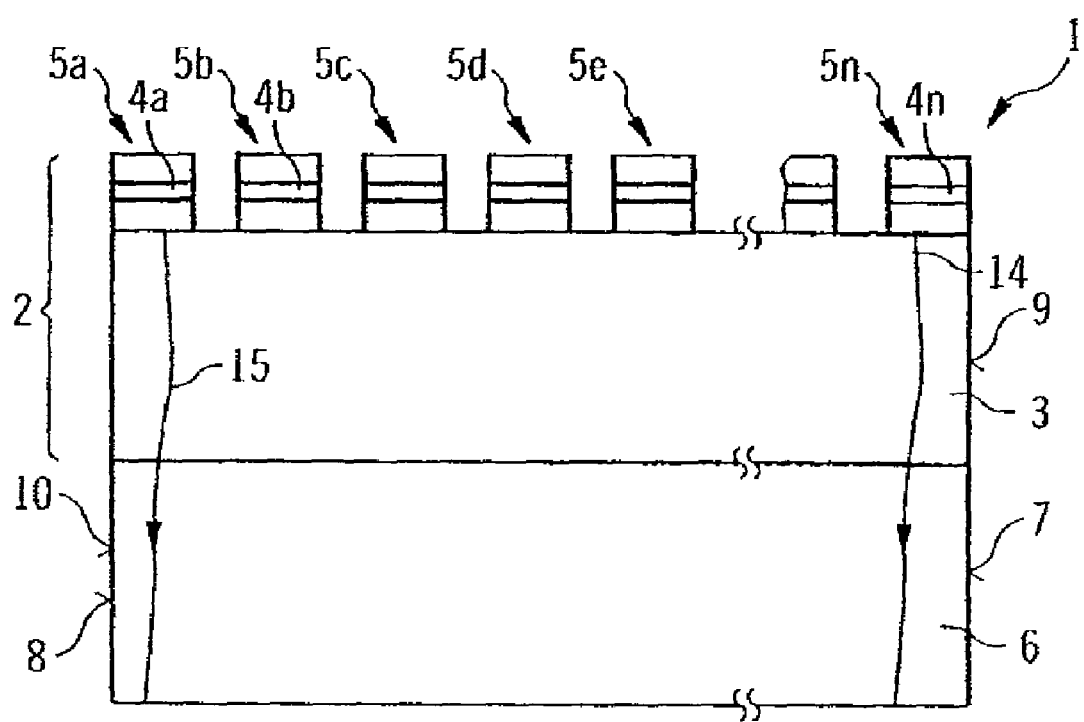

FIG. 2 shows an exemplary embodiment of a laser arrangement 1, based on a schematic plan view in FIG. 2A and a schematic section view in FIG. 2B. The laser arrangement 1 essentially corresponds to the laser arrangement illustrated in FIGS. 1A and 1B.

In contrast to this, elements of the laser arrangement are matched to one another in such a way that the operating temperature distribution in the lateral direction in the active regions is homogenized. The active regions are preferably of the same operating temperatures $T_a, T_b, T_c, T_d, \ldots, T_n$ at corresponding points in the respective active region in the lateral direction. In contrast to the laser arrangement shown in FIGS. 1A and 1B, the substrate 3 ends flush with the mount 6 in the lateral direction in the exemplary embodiment shown in FIG. 2. The edge surface 7 of the mount and the side surface 9 of the substrate, as well as the edge surface 8 and the side surface 10, for this purpose end flush with one another and preferably each form a continuous surface, particularly preferably a planar surface. Both the substrate 3 and the mount 6 limit the laser arrangement 1 in the lateral direction. Furthermore, the active regions 4a and 4n as well as the semiconductor bodies 5a and 5n respectively adjoin the respective side surface 10 or 9. The semiconductor bodies 5n and 5a, respectively, which are arranged next to the side surfaces 9 and 10 may, in particular, end flush with the substrate 3.

Lateral widening of the heat flow in the region of the side surfaces 9, 10 and of the edge surfaces 7, 8 can thus be avoided. The operating temperature stabilization in the lateral direction is in consequence simplified, since the operating temperature of those active regions which are arranged at the edge is matched to that of the active regions which are further away from the side surfaces, because the widening of the heat flow is suppressed. This is illustrated by the heat flow lines 14 and 15 which, in contrast to the lines in FIG. 1, are essentially straight lines and run in the vertical direction from the active region into the mount.

If required, the active regions 4a and 4n which are closest to the respective side surfaces 10 or 9 may also be arranged at a distance from these side surfaces in the lateral direction. As a precaution against significant widening of the heat flow in the substrate 3, this distance is preferably shorter than that between two adjacent active regions of the laser diode chip. Furthermore, the distance to the side surface in the lateral direction is preferably shorter than the distance of that active region which is closest to the respective side surface from the active region adjacent to it (for example shorter than the distance between the regions 4a and 4b). The distance between that active region which is closest to the respective side surface and this side surface is particularly preferably shorter than the shortest of the distances between the active regions of the laser diode chip. Alternatively or additionally, the distances between the active regions or the lateral dimensions of the active regions can be varied in order to stabilize the operating temperature (see the description of the following exemplary embodiments).

Furthermore, the side surfaces 9 and 10 may be arranged at a distance from the respective edge surfaces 7 and 8 in the lateral direction. As a precaution against significant widening of the heat flow in the mount 6, this distance is preferably shorter than one of the distances between two adjacent active regions of the laser diode chip and/or is shorter than the distance between that active region which is closest to the respective side surface and this side surface.

In the case of active regions arranged at equal distances of 110 μm from one another and with the same lateral dimension, it was possible to keep the operating temperature at corresponding points in different active regions essentially constant by such matching of the laser diode chip and the mount, while, in the case of a laser arrangement having a reference laser diode chip similar to that shown in FIG. 1, the operating temperature fluctuated by about 38 K. If the distance between the semiconductor bodies was 200 μm, the fluctuation in the operating temperature in the reference laser diode chip was approximately 33 K. This fluctuation could also be compensated.

It was also possible to achieve corresponding compensation of the fluctuation in the operating temperature by matching the laser diode chip 2 to the size of the mount in the case of a laser arrangement as shown in FIGS. 1C and 1D, as well as 1E. The edge-region contacts 50a and 50n are in this case preferably arranged in a corresponding manner to the semiconductor bodies 5a and 5n in the lateral direction, as close as possible to the side surfaces 9, 10 of the substrate 3, and in particular at the edge of the semiconductor layer structure 500. In consequence, the active regions at the edge are advantageously formed as close as possible to the mount edge or to the substrate edge. This therefore provides a particularly efficient precaution against widening of the heat flow.

FIG. 3A shows one exemplary embodiment of a laser diode chip 2, on the basis of a schematic plan view.

The laser diode chip 2 corresponds essentially to the laser diode chip described in conjunction with FIGS. 1A and 1B. In contrast to this, the semiconductor bodies 5a ... 5l with the active regions are not arranged at equal distances along the lateral main extent direction R. The distances $D_{ab}$, $D_{bc}$, $D_{cd}$, $D_{de}$, $D_{ef}$ and $D_{fg}$, respectively, between two adjacent semiconductor bodies in fact increase as the distance between the semiconductor bodies and the respective side surface 10 or 9 of the substrate 3 increases ($D_{ab} < D_{bc} < D_{cd}$). The linear population density of the laser diode chip 2 with active regions accordingly decreases in the lateral direction as the distance from the respective side surface increases.

In this case, the expression linear population density means the ratio of the sections occupied by active regions when passing along the laser diode chip in the lateral direction of main extent R of the laser diode chip to the total distance covered along the lateral main extent direction of the laser diode chip.

This therefore results in an increase in the loss heat generated in the region of the side surfaces 9 and 10, such as compared to the laser diode chips shown in FIG. 1. This makes it possible to compensate for the lateral widening of the heat flow which occurs as a result of the active regions being arranged at a distance from the side surface, and to homogenize the lateral operating temperature distribution of the active regions. The active regions or the semiconductor bodies are preferably arranged in such a manner that the operating temperatures are the same ($T_a = T_b = \ldots = T_l$).

For homogeneous distribution of the operating temperature in the lateral direction, it is particularly advantageous to arrange the active regions or the semiconductor bodies on the substrate 3 axially symmetrically with respect to the axis of symmetry 16 of the laser diode chip 2, which runs perpendicularly to the lateral direction of main extent R and/or parallel to that surface of the substrate 3 on which the semiconductor bodies are arranged. The semiconductor bodies or the active regions are thus preferably arranged symmetrically with respect to this axis of symmetry 16. It is particularly preferable for the entire laser diode chip 2 to be designed to be axially symmetrical with respect to this axis.

Overall, an operating temperature profile which runs in the same way laterally in the active regions can thus be achieved by means of a suitable choice of the distances between the adjacent active regions and semiconductor bodies, in particular in the case of semiconductor bodies of the same width, as well.

It has been found to be particularly expedient to vary the distance between adjacent active regions, particularly in steps of a predetermined size, between a smallest of the distances between adjacent active regions of D/3, preferably of D/5, particularly preferably of D/10, and a greatest of the distances between adjacent active regions D.

In the central region around the center of the laser diode chip 2, fluctuations in the operating temperature distribution between different active regions, particularly in the lateral direction, are quite small, so that, in some circumstances, there is no need to vary the distances in order to homogenize the operating temperature distribution in this region ($D_{de} = D_{ef} = D_{fg}$ or preferably $D_{de} < D_{ef} < D_{fg}$).

Corresponding homogenization of the operating temperatures of the active regions can also be achieved in the case of a laser diode chip 2 whose active regions are formed by zones of a continuous active layer 400 into which layer current is discretely impressed to form the active regions (see FIGS. 1C, 1D and 1E, respectively). The distances between contacts 50a ... 50l are varied in an appropriate manner, instead of varying the distances between semiconductor bodies, for this purpose. The statements relating to the variation of distances that have been made above also apply in a corresponding manner to the exemplary embodiment of a laser diode chip 2 illustrated on the basis of a schematic plan view in FIG. 3B. The statements for the semiconductor bodies and the active regions thus also apply for the configuration of the contacts.

The contacts are preferably formed striplike, in particular in the form of rectangles, when seen in a plan view. In particular, the contacts may have the same widths.

A variation of the distance between the adjacent active regions in this way not only makes it possible to compensate for the operating temperature gradient over different active regions of a reference laser diode chip, but even to reverse this gradient.

This is illustrated in FIGS. 4A and 4B, which each show a schematic section view through a laser arrangement 1, similar to the laser arrangements shown in FIGS. 1A, 1B and 2. The semiconductor bodies $5a \ldots 5g$ and the active regions of the laser diode chips each have the same widths.

Owing to the widening of the heat flow from the semiconductor bodies $5a \ldots 5g$, which are arranged at equal distances from one another in the reference laser diode chip shown in FIG. 4A, to the side of the side surface 9, the operating temperature of the active regions increases in the lateral direction, starting from this side surface. In the case of the laser diode chip shown in FIG. 4B, the distance between adjacent active regions on the part of the side surface 9 is decreased as compared to the reference laser diode chip, and is increased on the part of the side surface 10. An increase such as this in the linear population density of the laser diode chip 2 with active regions in comparison to that of the reference laser diode chip shown in FIG. 4A to the side of the side surface 9 of the substrate 3 makes it possible to reverse the operating temperature gradient, in comparison to that of the reference laser diode chip, despite lateral widening of the heat flow to the side surface 9 within the substrate. In FIG. 4B, the linear population density decreases in the lateral direction R, starting from that active region which is closest to the side surface 9, as the distance from the side surface 9 increases.

A corresponding situation applies to the influence on the operating temperatures for a laser arrangement 1 as shown in FIGS. 1C, 1D, 1E and the chip as shown in FIG. 3B, for the variation of the distances between the contacts.

In the case of the laser diode chips 2 described in conjunction with FIGS. 1, 2 and 3, the active regions preferably each have the same active area.

FIGS. 5A-5B show one exemplary embodiment of a laser diode chip 2 according to the invention, based on a schematic plan view. The laser diode chip 2 essentially corresponds to the laser diode chip described in conjunction with FIGS. 3A-3B. Instead of or in addition to the variation of the distances between the semiconductor bodies $5a \ldots 5k$ or between the active regions, their lateral dimensions, that is to say the widths $b_a \ldots b_k$ of the semiconductor bodies or of the active regions are varied.

The active regions accordingly have different widths but, if required, may be arranged at equal distances from one another. The linear population density of the laser diode chip with active regions in zones of the laser diode chip with pronounced lateral widening of the heat flow can also be increased by variation of the widths, in such a manner that the operating temperatures of the active regions are essentially constant ($T_a = \ldots = T_k$).

The widths of the active regions preferably decrease as the distance from the side surface 10 of the substrate 3 increases ($b_a > b_b > b_c > b_d$). In this case as well, and corresponding to the exemplary embodiment shown in FIGS. 3A-3B, active regions which are arranged comparatively centrally on the substrate 3 may be designed to have the same widths ($b_d = b_e$), because of the comparatively low influence of the widening of the heat flow on the operating temperature in this zone. Once again, an axially symmetrical arrangement with respect to the axis of symmetry 16 is particularly suitable for a homogeneous, in particular symmetrical, operating temperature profile.

It has been found to be particularly expedient for the greatest of the widths of the active regions of the laser diode chip to be 1.2-times or more, preferably 1.5-times or more, and particularly preferably twice or more, than the smallest of the widths of the active regions of the laser diode chip in the lateral direction of main extent.

The laser diode chip 2, a schematic plan view of which is illustrated in FIG. 5B, corresponds except for the configuration of the contacts to the laser diode chips described in conjunction with FIGS. 1C and 1D, as well as 1E. In the case of this chip as well, the operating temperature distribution is stabilized, but with the width of the contacts $50a \ldots 50k$ having been appropriately varied, in contrast to the semiconductor bodies as shown in FIG. 5A. The statements relating to the semiconductor bodies can thus also apply to the contact strips, in particular to their width.

The active regions shown in FIGS. 5A, 5B have different active areas.

The exemplary embodiments shown in FIGS. 3A, 3B, 4B, 5A and 5B, in which the operating temperature distribution is influenced by the configuration and/or arrangement of the active regions, may be implemented in a simpler manner than in the case of the exemplary embodiment shown in FIG. 2A, owing to the reduced adjustment and matching effort. However, in the case of the first-mentioned exemplary embodiments, it may be necessary to adapt the production process for the laser diode chip, and not to use a standardized process. For example, it may be necessary to match masks which are used for the formation of the semiconductor bodies and their contacts to the different dimensions of and/or distances between the semiconductor bodies and the contacts. Such measures can be dispensed with when the laser diode chip is being matched to the mount, for example as in the case of the exemplary embodiment shown in FIG. 2A.

If required, it is also possible within the scope of the invention to use a suitable deliberate arrangement and/or configuration of the active regions to also form a predetermined operating temperature profile over the active regions which has an inhomogeneous profile, that is to say the operating temperatures can be designed such that they deliberately differ from one another in different active regions, in particular in the lateral direction.

Figure 6:
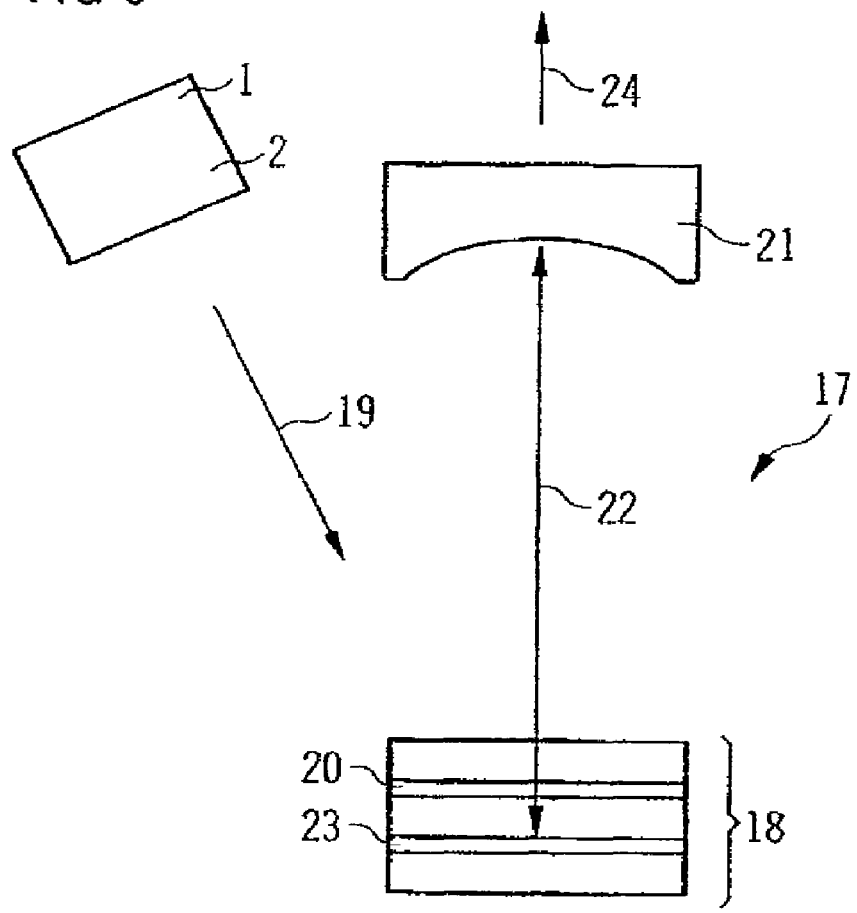
FIG. 6 shows a schematic view of one exemplary embodiment of an optically pumped semiconductor laser.

FIG. 6 shows a schematic plan view of one exemplary embodiment of an optically pumped semiconductor laser according to an embodiment of the invention.

The optically pumped semiconductor laser 17 comprises a surface-emitting semiconductor structure 18 which is optically pumped by means of a laser diode chip 2 or a laser arrangement 1 as the pump radiation source, which may be designed according to one of the preceding exemplary embodiments. For this purpose, the pump radiation source is arranged in such a manner that pump radiation 19 is absorbed in an active zone 20 of the semiconductor laser, for example comprising a quantum well structure. The active zone is thus optically excited to emit radiation of a wavelength greater than the one of the pump radiation. This radiation emerges from a surface of the semiconductor structure. It is thus possible for a radiation field 22 to be formed in an external resonator of the semiconductor laser 17 which is bounded by means of at least one external mirror 21. This radiation can be amplified in the semiconductor structure 18. The resonator is bounded by a further mirror 23 which is preferably monolithically integrated, for example as a Bragg mirror, in the semiconductor structure 18, in particular together with the active zone 20. The external mirror 21 is preferably implemented as an output mirror for laser radiation 24 from the resonator. The semiconductor laser is, in particular, implemented as an optically pumped VECSEL.

Since the emission spectrum of the pump radiation source according to the above embodiments may have a comparatively narrow bandwidth as a result of the stabilization of the operating temperature and the configuration and/or arrangement of the active regions, the semiconductor laser 17 can be pumped very efficiently and in a simplified manner by means of a pump radiation source whose operating temperature has been stabilized.

Figure 7:
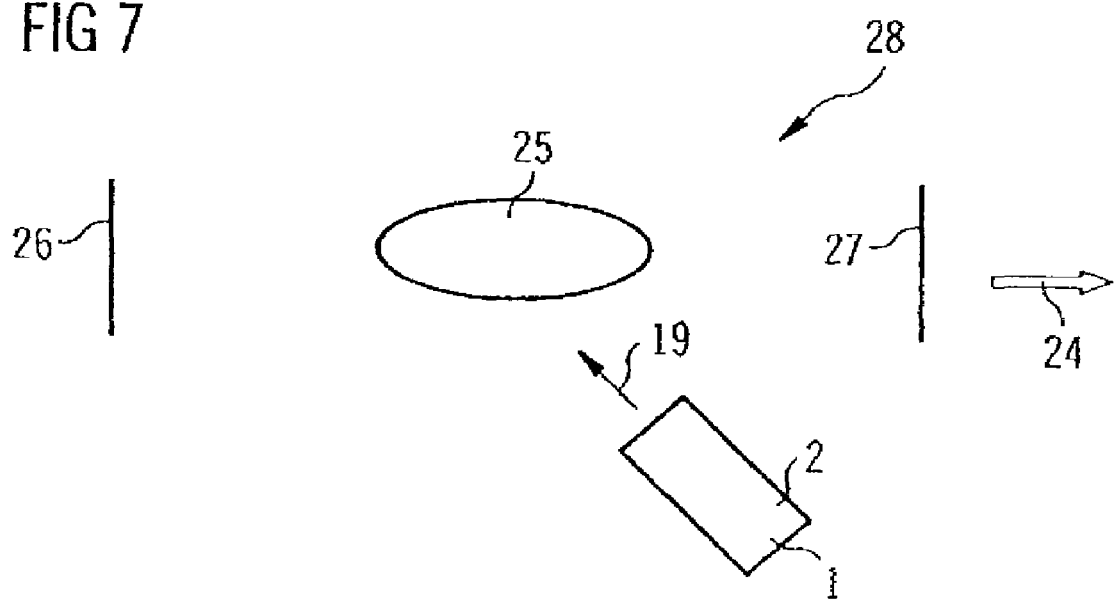
FIG. 7 shows a schematic view of one exemplary embodiment of an optically pumped laser.

FIG. 7 shows a schematic plan view of one exemplary embodiment of an optically pumped laser. As described in conjunction with FIG. 6, a laser diode chip 2 or a laser arrangement 1 is used as a pump radiation source, particularly with its operating temperature being stabilized. The pump radiation 19 is absorbed and re-emitted in an amplification medium 25 which is suitable for achieving laser activity. The re-emitted radiation is amplified by means of the amplification medium 25 in a resonator, formed by means of the mirrors 26 and 27. The amplified radiation can be output from the resonator as laser radiation 24. The laser 28 shown in FIG. 7 is, for example, in the form of a solid-state disk laser, a solid-state rod laser or a fiber laser. Because of the generally narrow absorption spectrum in the amplification medium 25, pumping using a pump radiation source which (like the laser arrangement whose operating temperature has been stabilized, or a correspondingly stabilized laser diode chip) has a narrow emission spectrum is particularly advantageous.

Furthermore, in the case of a laser diode apparatus having discrete laser diode chips which are arranged on a common chip mount, corresponding operating temperature stabilization can also be achieved by matching the dimensions of the laser diode apparatus to a thermally conductive mount, variation of the lateral dimensions and/or variation of the distances between the laser diode chips. In the case of laser diode chips which have a plurality of active regions, operating temperature stabilization is, however, particularly advantageous, because of the particularly compact configuration.

Furthermore, within the scope of the invention, a laser arrangement may also have a plurality of laser diode chips, whose operating temperatures have preferably been stabilized.

It should be noted that the invention may also be used, if required, for other radiation-emitting semiconductor chips, such as LED chips having a plurality of active regions arranged in particular on a common substrate. Because the power losses in semiconductor lasers are often particularly high, the invention is, however, particularly suitable for lasers.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

We claim:

1. A laser arrangement comprising:
   a mount;
   at least one laser diode apparatus arranged on the mount, the at least one laser diode apparatus having a side surface which laterally limits the at least one laser diode apparatus; and
   a plurality of active regions arranged laterally side by side and configured to produce radiation;
   wherein at least one of (i) a distance between the side surface and an edge which laterally limits the mount on a part of the side surface is shorter than the distance between an active region of said plural active regions which is closest to the side surface and the side surface, and (ii) the distance between the side surface and the edge is shorter than the distance between two adjacent active regions of said plural active regions of the at least one laser diode apparatus.

2. The laser arrangement as claimed in claim 1, wherein the distance between the side surface and the edge is shorter than a shortest distance between active regions of the laser diode apparatus.

3. The laser arrangement as claimed in claim 1, wherein the side surface ends flush with the edge.

4. The laser arrangement as claimed in claim 1, wherein the mount comprises a heat sink or a submount.

5. The laser arrangement as claimed in claim 1, wherein at least one of a lateral dimension of each of said plural active regions varies in a lateral direction and the distance between adjacent active regions varies in the lateral direction.

6. A laser arrangement comprising:
   a mount;
   at least one laser diode apparatus arranged on the mount, the at least one laser having a side surface which laterally limits the at least one laser diode apparatus; and
   a plurality of active regions arranged laterally side by side and configured to produce radiation;
   wherein at least one of (i) a distance between the side surface and an edge which laterally limits the mount on a part of the side surface is shorter than the distance between an active region of said plural active regions which is closest to the side surface and the side surface, and (ii) the distance between the side surface and the edge is shorter than the distance between two adjacent active regions of said plural active regions of the at least one laser diode apparatus; and
   wherein one of (i) an active region of said plural active regions adjoins the side surface and (ii) an active region of said plural active regions closest to the side surface is arranged at a distance from the side surface which is shorter than the distance between two adjacent active regions of said plural active regions of the laser diode apparatus.

* * * * *